United States Patent
Chang et al.

(10) Patent No.: US 8,552,485 B2
(45) Date of Patent: Oct. 8, 2013

(54) SEMICONDUCTOR STRUCTURE HAVING METAL-INSULATOR-METAL CAPACITOR STRUCTURE

(75) Inventors: Chun Hua Chang, Zhubei (TW); Sung-Hui Huang, Dongshan Township (TW); Der-Chyang Yeh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 98 days.

(21) Appl. No.: 13/161,076

(22) Filed: Jun. 15, 2011

(65) Prior Publication Data

US 2012/0319239 A1    Dec. 20, 2012

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl.
USPC ..... 257/296; 257/300; 257/303; 257/E27.086

(58) Field of Classification Search
USPC ............. 257/296, 300, 303, 304, 306, 532, 257/E27.086
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |

(Continued)

*Primary Examiner* — Hoai V Pham
(74) *Attorney, Agent, or Firm* — Lowe Hauptman & Ham, LLP (57) ABSTRACT

A semiconductor structure includes a through-substrate-via (TSV) structure disposed in a substrate. A first etch stop layer is disposed over the TSV structure. A first dielectric layer is disposed in contact with the first etch stop layer. A first conductive structure is disposed through the first etch stop layer and the first dielectric layer. The first conductive structure is electrically coupled with the TSV structure. The TSV structure is substantially wider than the first conductive structure. A second etch stop layer is disposed in contact with the first dielectric layer. A metal-insulator-metal (MIM) capacitor structure is disposed in contact with the second etch stop layer.

8 Claims, 11 Drawing Sheets

(56) References Cited

U.S. PATENT DOCUMENTS

| | | |
|---|---|---|
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2010/0117197 A1* | 5/2010 | Cho .............................. 257/532 |

* cited by examiner

SEMICONDUCTOR STRUCTURE HAVING METAL-INSULATOR-METAL CAPACITOR STRUCTURE

TECHNICAL FIELD

The present disclosure relates generally to the field of semiconductor devices and, more particularly, to semiconductor structures and methods of forming the same.

BACKGROUND OF THE DISCLOSURE

In integrated circuits, capacitors are components for many data storage applications. In general, a capacitor includes two conductive electrodes on opposing sides of a dielectric or other insulating layer, and may be categorized based on the materials employed to form the electrodes. For example, in a metal-insulator-metal (MIM) capacitor, the electrodes substantially comprise metallic materials. MIM capacitors offer the advantage of a relatively constant value of capacitance over a relatively wide range of voltages applied thereto. MIM capacitors also exhibit a relatively small parasitic resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Three-dimensional integrated circuits (3D IC) have been proposed to integrate more transistors and circuits in a given certain area. In a process of forming a 3D IC, two dies, each including respective integrated circuits, are disposed to opposing surfaces of an interposer. Through-substrate-via (TSV) structures, also referred to as through-wafer-via structures, are formed in the interposer, providing electrical connection between the dies.

An interposer includes a substrate through which a TSV structure is formed. A dielectric layer is formed over the TSV structure. A copper bulk which is wider than the TSV structure is formed in the dielectric layer and in contact with the TSV structure. An etch stop layer is then formed on the dielectric layer.

To provide a charge storage, a MIM capacitor is formed on the etch stop layer. A method of forming the MIM capacitor that is known the applicants includes forming a sandwiched capacitor plate/capacitor dielectric/capacitor plate layers on the etch stop layer. A removal process using chemicals removes portions of the sandwiched layers to pattern the MIM capacitor. The applicants find that the removal process may over remove the etch stop layer that is directly under the sandwiched layers, attacking hillocks of the copper bulk. The chemicals of the removal process may result in the corrosion at the top surface of the copper bulk. If a via plug is formed over and in contact with the corroded copper bulk, an interconnect open between the via plug and the corroded copper bulk may occur.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present application is related to a semiconductor structure including a through-substrate-via (TSV) structure. In some embodiments, a semiconductor structure includes a through-substrate-via (TSV) structure that is disposed in a substrate. A first etch stop layer is disposed over the TSV structure. A first dielectric layer is disposed in contact with the first etch stop layer. A first conductive structure is disposed through the first etch stop layer and the first dielectric layer and electrically coupled with the TSV structure, wherein the TSV structure is substantially wider than the first conductive structure. A second etch stop layer is disposed in contact with the first dielectric layer. A metal-insulator-metal (MIM) capacitor structure is disposed in contact with the second etch stop layer.

Figure 1A:
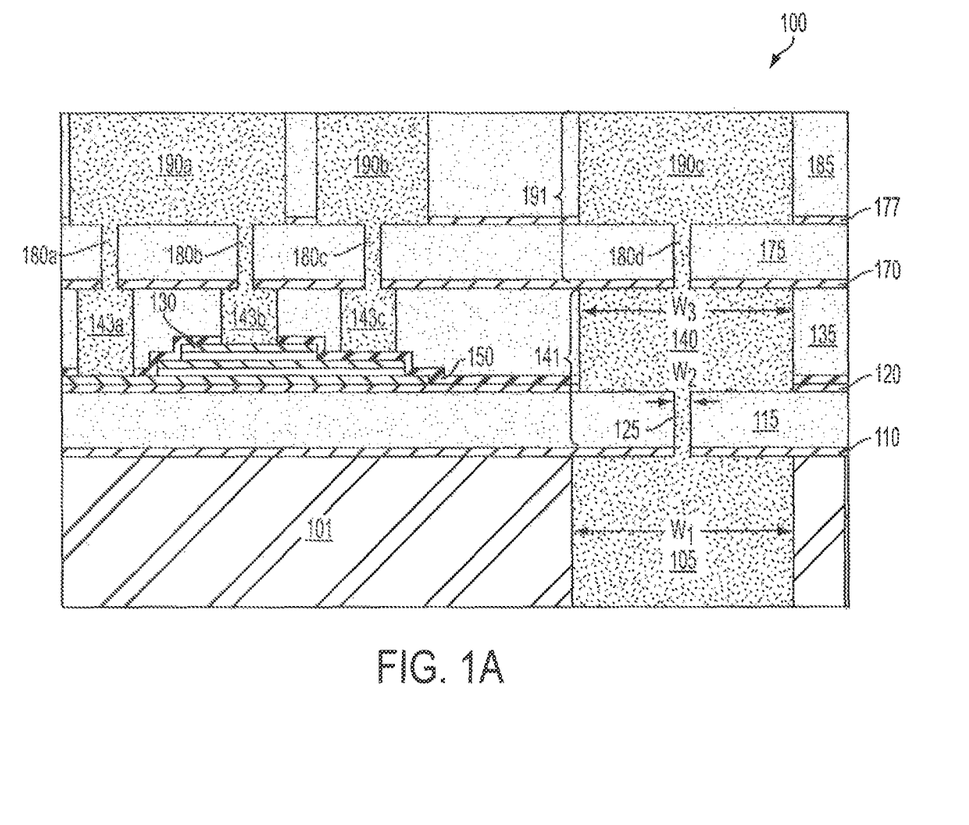
FIG. 1A is a schematic cross-sectional view of an exemplary semiconductor structure.

For example, FIG. 1A is a schematic cross-sectional view of an exemplary semiconductor structure. In some embodiments, a semiconductor structure 100 can be referred to as an interposer. The interposer can be configured to provide electrical connection in a 3-dimensional (3-D) integrated circuit package system. In some embodiments, the interposer can include at least one passive device, e.g., a capacitor, a resistor, and/or an inductor. In other embodiments, the interposer can be substantially free from including any active device, e.g., metal-oxide-semiconductor (MOS) transistors, bipolar junction transistors (BJTs), complementary MOS (CMOS) transistors, etc. In still other embodiments, the interposer can be referred to as a passive interposer.

In some embodiments, the semiconductor structure 100 may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, devices, circuits, and/or any combinations thereof.

Referring to FIG. 1A, the semiconductor structure 100 includes a through-substrate-via (TSV) structure 105 that is disposed in a substrate 101. In some embodiments, the substrate 101 may include an elementary semiconductor including silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1A, the TSV structure 105 is disposed in the substrate 101. In some embodiments, the TSV structure 105 continuously extends through the substructure 101. In some embodiments, the TSV structure 105 can include at least one barrier material and at least one conductive material. The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof.

Referring to FIG. 1A, an etch stop layer 110 is disposed over the TSV structure 105. In some embodiments, the etch stop layer 110 can be made of at least one material, such as silicon nitride, silicon oxynitride, silicon carbide, silicon oxycarbide, silicon carbon nitride, other dielectric materials, and/or any combinations thereof.

In FIG. 1A, a dielectric layer 115 is disposed in contact with the etch stop layer 110. In some embodiments, the dielectric layer 115 can be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low dielectric constant (low-k) material, a ultra low-k dielectric material, and/or any combinations thereof. In some embodiments, the dielectric layer 115 can be referred to as via inter metal dielectric (IMD) layer. It is noted that though merely showing a single dielectric layer 115 in FIG. 1A, the scope of this application is not limited thereto. In some embodiments, the dielectric layer 115 can be a multiple-layer dielectric structure.

Referring to FIG. 1A, a conductive structure 125 is disposed through the etch stop layer 110 and the dielectric layer 115 and electrically coupled with the TSV structure 105. The TSV structure 105 is substantially wider than the conductive structure 125. In some embodiments, a width $W_1$ of the TSV structure 105 is larger than a width $W_2$ of the conductive structure 125. In other embodiments, the TSV structure 105 has a width $W_1$ of about several to tens of microns (μm). The conductive structure 125 has a width $W_2$ of about thousands of angstrom (Å) to a micron. It is noted that the widths of the TSV structure 105 and/or the conductive structure 125 are merely exemplary. In some embodiments, the widths of the TSV structure 105 and/or the conductive structure 125 may vary depending on the technology node of the semiconductor structure 100.

In some embodiments, the conductive structure 125 can include at least one barrier material and at least one conductive material. The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof. In some embodiments, the conductive structure 125 can be a via plug structure, a single damascene structure, a contact plug structure, a conductive bulk, a conductive slat, a conductive line, or any other conductive structure shape. In some other embodiments, the conductive structure 125 can be referred to as a via portion of a dual damascene structure 141.

Referring again to FIG. 1A, an etch stop layer 120 is disposed in contact with the dielectric layer 115. In some embodiments, the etch stop layer 120 can be made of at least one material, such as silicon nitride, silicon oxynitride, silicon carbide, silicon oxycarbide, silicon carbon nitride, other dielectric materials, and/or any combinations thereof.

Referring to FIG. 1A, a metal-insulator-metal (MIM) capacitor structure 130 is disposed in contact with the etch stop layer 120. In some embodiments, the MIM capacitor structure 130 can include a signal MIM capacitor or a plurality of MIM capacitors that are electrically coupled to each other in a parallel fashion. The MIM capacitor structure 130 can include a plurality of metallic capacitor plates and at least one capacitor dielectric layer (not labeled) that is disposed between two metallic capacitor plates.

In some embodiments, the metallic capacitor plates can each be made of at least one material, such as aluminum, copper, aluminum copper, tantalum, tantalum nitride, titanium, titanium nitride, tantalum silicon nitride, tungsten, tungsten nitride, other metallic materials, and/or any combinations thereof. In some embodiments, the capacitor dielectric layer can have a dielectric constant that is equal to or higher than that of a silicon dioxide, e.g., about 3.9. To increase the capacitance of the MIM capacitor, the thickness of the capacitor dielectric layer can be reduced and/or a high dielectric constant (high-k) material can be adapted as the capacitor dielectric layer. For example, the capacitor dielectric layer can be made of at least one material, such as silicon oxynitride, silicon nitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other dielectric materials, and/or any combinations thereof.

In some embodiments, the semiconductor structure 100 includes a dielectric layer 135 that is disposed over the MIM capacitor structure 130. In some embodiments, the dielectric layer 135 can be made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low dielectric constant (low-k) material, a ultra low-k dielectric material, and/or any combinations thereof. In some embodiments, the dielectric layer 135 can be referred to as trench inter metal dielectric (IMD) layer. It is noted that though merely showing a single dielectric layer 135 in FIG. 1A, the scope of this application is not limited thereto. In some embodiments, the dielectric layer 135 can be a multiple-layer dielectric structure.

In some embodiments, the semiconductor structure 100 includes a conductive structure 140 that is disposed in the dielectric layer 135 and electrically coupled with the conductive structure 125, wherein the conductive structure 140 is substantially wider than the conductive structure 125. In some embodiments, a width $W_3$ of the conductive structure 140 is larger than a width $W_2$ of the conductive structure 125. In some other embodiments, the conductive structure 140 has a width $W_3$ of about several to tens of microns (μm). It is noted that the width of the conductive structure 140 is merely exemplary. In some embodiments, the width of the conductive structure 140 may vary depending on the technology node of the semiconductor structure 100.

In some embodiments, the conductive structure 140 can include at least one barrier material and at least one conductive material. The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof. In some embodiments, the conductive structure 140 can be a conductive bulk, a conductive slat, a conductive line, or any other conductive structure shape. In some other embodiments, the conductive structure 140 can be referred to as a trench portion of the dual damascene structure 141.

As noted, in some embodiments the conductive structures 125 and 140 constitute the dual damascene structure 141. The metallic layer of the conductive structure 125 is not configured to provide electrical routing in the dielectric layer 115. The conductive structure 125 is configured merely to provide electrical connection between the TSV structure 105 and the conductive structure 140. The metallic layer of the conductive structure 140 is configured to provide electrical routing in the dielectric layer 135.

In some embodiments, the semiconductor structure 100 includes a cap layer 150 that is disposed over the MIM capacitor structure 130. The cap layer 150 can be a single layer or a multi-layer structure. The cap layer 150 can be made of at least one material, such as silicon oxide, silicon nitride, silicon oxynitride, silicon carbide, silicon oxycarbide, silicon carbon nitride, other dielectric materials, and/or any combinations thereof. In some embodiments, the cap layer 150 is a dual-layer structure including a silicon oxide layer and a silicon nitride layer formed thereon.

Referring to FIG. 1A, conductive structures 143a-143c are formed in the dielectric layer 135. The conductive structures 143a-143c can each be electrically coupled with one of the metallic capacitor plates of the MIM capacitor structure 130 for electrical connection. The conductive structures 143a-143c can be made of at least one material that is the same as or similar to that of the conductive structure 140.

Referring to FIG. 1A, an etch stop layer 170 is disposed over the dielectric layer 135. The etch stop layer 170 can be made of at least one material that is the same as or similar to that of the etch stop layer 110. A dielectric layer 175 can be disposed over the etch stop layer 170. The dielectric layer 175 can be made of at least one material that is the same as or similar to that of the dielectric layer 115.

In some embodiments, conductive structures 180a-180d can be disposed through the dielectric layer 175 and the etch stop layer 170. The conductive structures 180a-180d can be electrically coupled with the conductive structures 143a-143c and 140, respectively. In some embodiments, the conductive structures 180a-180d can be made of at least one material that is the same as or similar to that of the conductive structure 125.

Referring to FIG. 1A, an etch stop layer 177 is disposed over the dielectric layer 175. The etch stop layer 177 can be made of at least one material that is the same as or similar to that of the etch stop layer 120. A dielectric layer 185 can be disposed over the etch stop layer 177. The dielectric layer 185 can be made of at least one material that is the same as or similar to that of the dielectric layer 135.

In some embodiments, conductive structures 190a-190c can be disposed through the dielectric layer 185 and the etch stop layer 177. The conductive structures 190a-190c can be electrically coupled with the conductive structures 180a-180b, 180c and 180d, respectively. In some embodiments, the conductive structures 190a-190c can be made of at least one material that is the same as or similar to that of the conductive structure 140.

In some embodiments, the conductive structures 180d and 190c constitute a dual damascene structure 191. The conductive structures 180d and 190c can be referred to a via portion and a trench portion, respectively, of the dual damascene structure 191. The metallic layer of the conductive structure 180d is not configured to provide electrical routing in the dielectric layer 175. The conductive structure 180d is configured merely to provide electrical connection between the conductive structures 140 and the 190c. The metallic layer of the conductive structure 190c is configured to provide electrical routing in the dielectric layer 185.

It is noted that the number of the metallic layers of the conductive structures 125, 140, 180d and 190c is merely exemplary. In some embodiments, more or less metallic layers can be used to provide electrical connection with the TSV structure 105.

Figure 1B:
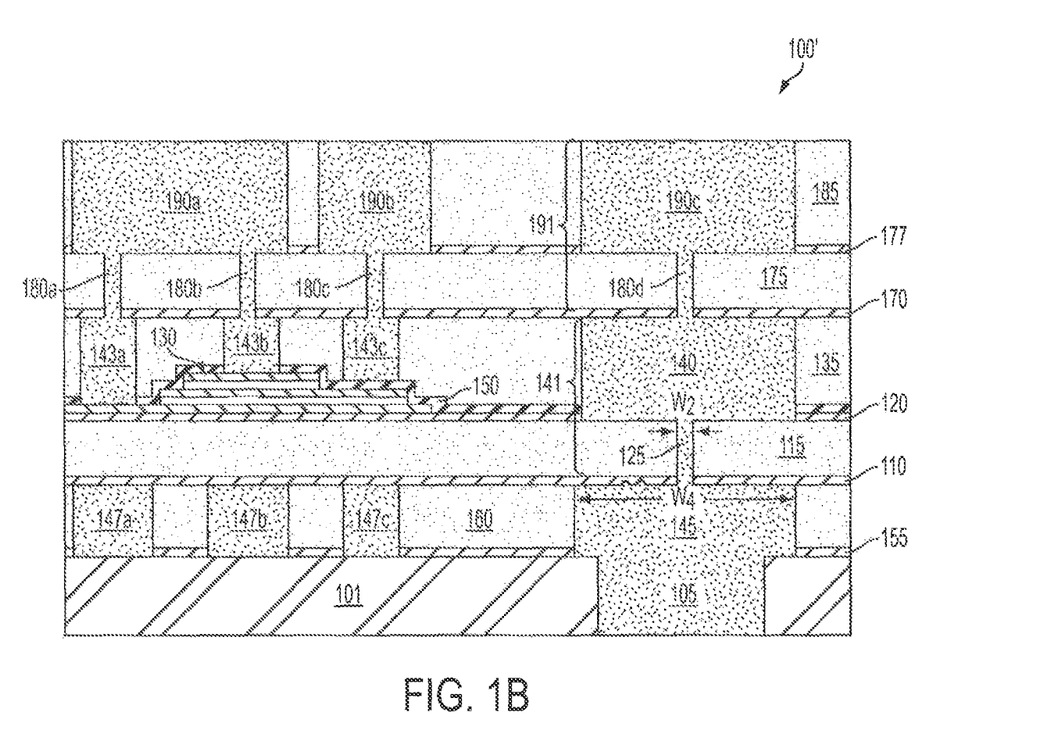
FIG. 1B is a schematic cross-sectional view of another exemplary semiconductor structure.

FIG. 1B is a schematic cross-sectional view of another exemplary semiconductor structure. In some embodiments, a semiconductor structure can include a conductive structure that is disposed between the TSV structure 105 and the etch stop layer 110. For example, a semiconductor structure 100' includes a conductive structure 145 that is disposed between the TSV structure 105 and the conductive structure 125 as shown in FIG. 1B. In some embodiments, the conductive structure 145 is substantially wider than the conductive structure 125. For example, a width $W_4$ of the conductive structure 145 is larger than a width $W_2$ of the conductive structure 125. In some other embodiments, the conductive structure 145 has a width $W_4$ of about several to tens of microns (μm). In still other embodiments, the conductive structure 145 is wider than the TSV 105. It is noted that the width of the conductive structure 145 is merely exemplary. In some embodiments, the width of the conductive structure 145 may vary depending on the technology node of the semiconductor structure 100'.

In some embodiments, the conductive structure 145 can include at least one barrier material and at least one conductive material. The at least one barrier material can include, for example, titanium, titanium-nitride, tantalum, tantalum-nitride, other barrier materials, and/or combinations thereof. The at least one conductive material can include, for example, aluminum, copper, aluminum-copper, polysilicon, other conductive materials, and/or combinations thereof. In some embodiments, the conductive structure 145 can be a trench bulk structure, a via plug structure, a single damascene structure, a contact plug structure, a conductive bulk, a conductive slat, a conductive line, or any other conductive structure shape. In some other embodiments, the metallic layer of the conductive structure 145 can be referred to as a metal zero (Mz) layer. In still other embodiments, the Mz layer can be configured to provide electrical routing in a dielectric layer 160 and electrical connection between the TSV structure 105 and the conductive structure 125.

Referring to FIG. 1B, an etch stop layer 155 is disposed over the substrate 101. The etch stop layer 155 can be made of at least one material that is the same as or similar to that of the etch stop layer 110 described above in conjunction with FIG. 1A. The dielectric layer 160 can be disposed over the etch stop layer 155. The dielectric layer 160 can be made of at least one material that is the same as or similar to that of the dielectric layer 115 described above in conjunction with FIG. 1A.

In some embodiments, conductive structures 147a-147c are disposed in the dielectric layer 160. The conductive structure 147a-147c can be configured to provide electrical routing in the dielectric layer 160. The conductive structure 145 can be configured to provide electrical connection between the TSV structure 105 and the conductive structure 125. In some embodiments, the conductive structures 147a-147c can be made of at least one material that is the same as or similar to that of the conductive structure 145.

Figure 2:
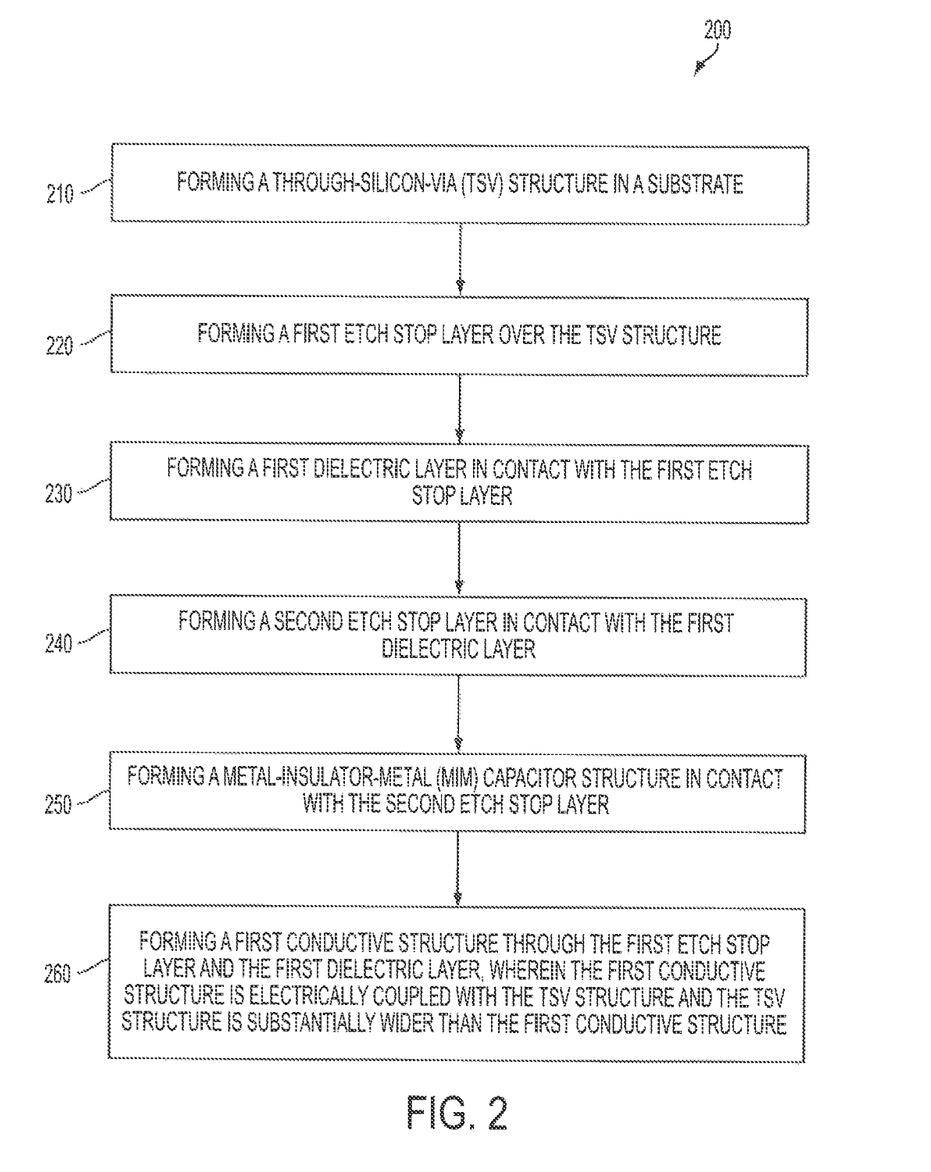
FIG. 2 is a flowchart of an exemplary method of forming a semiconductor structure.

FIG. 2 is a flowchart of an exemplary method of forming a semiconductor structure. FIGS. 3A-3H are schematic cross-sectional views of a semiconductor structure during various fabrication stages. Items of a semiconductor structure 300 in FIGS. 3A-3H that are the same or similar items of the integrated circuit 100' in FIG. 1B are indicated by the same reference numerals, increased by 200. It is understood that FIGS. 2 and 3A-3H have been simplified for a better understanding of the concepts of the present disclosure. Accordingly, it should be noted that additional processes may be provided before, during, and/or after the methods of FIGS. 2 and 3A-3H, and that some other processes may only be briefly described herein.

Referring now to FIG. 2, a method 200 of forming a semiconductor structure includes forming a through-substrate-via (TSV) structure in a substrate (block 210). A first etch stop layer is formed over the TSV structure (block 220). A first dielectric layer is formed in contact with the first etch stop layer (block 230). A second etch stop layer is formed in contact with the first dielectric layer (block 240). A metal-insulator-metal (MIM) capacitor structure is formed in contact with the second etch stop layer (block 250). A first conductive structure is formed through the first etch stop layer and the first dielectric layer, wherein the first conductive structure is electrically coupled with the TSV structure and the TSV structure is substantially wider than the first conductive structure (block 260).

Referring to FIG. 2, the block 210 includes forming a through-substrate-via (TSV) structure in a substrate. For example, a TSV structure 305 is formed in the substrate 301 as show in FIG. 3A. The TSV structure 305 can be formed by applicable methods known to the applicants for forming a TSV structure. In some embodiments, an etch stop layer 355 and a dielectric layer 360 are sequentially formed over the substrate 301. The etch stop layer 355 and the dielectric layer 360 each can be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Figure 3A:
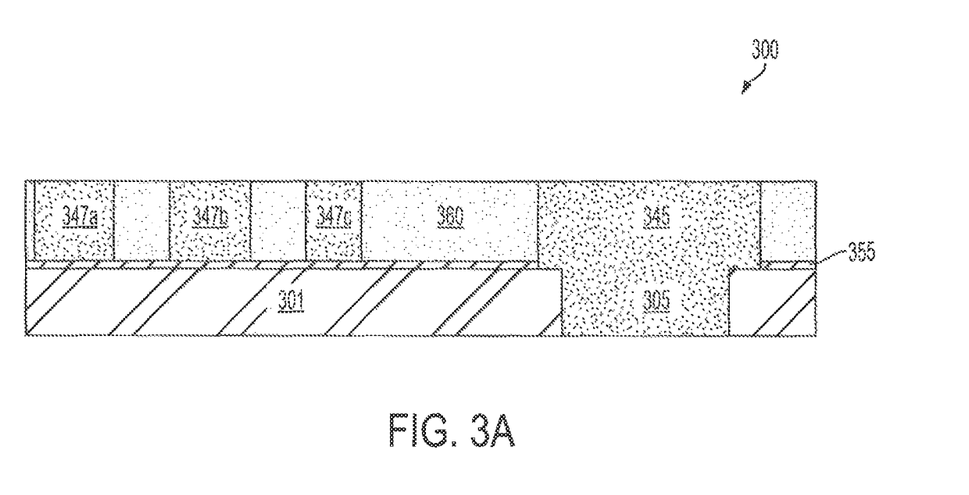
FIGS. 3A-3H are schematic cross-sectional views of a semiconductor structure during various fabrication stages.

Referring to FIG. 3A, conductive structures 347a-347c and 345 can be formed in the dielectric layer 360. In some embodiments, the formation of the conductive structures 347a-347c and 345 can include forming a plurality of openings (not labeled) in the dielectric layer 360. The openings can be formed by means which involves coating and patterning a photoresist layer (not shown) on the dielectric layer 360 and forming the openings through the dielectric layer 360 by a dry etch process. The remaining photoresist layer can be stripped by an ashing and/or with an application of a liquid stripper. After that, a diffusion barrier layer (not shown) can be formed over the dielectric layer 360 and on the sidewalls of the openings by, for example, a CVD process, a PECVD process, a physical vapor deposition (PVD) process, an atomic layer deposition (ALD), other suitable processes, and/or any combinations thereof. A following metallic material can be deposited by a CVD, PVD, ALD, electroplating method, other processes that is suitable to fill the openings. The diffusion barrier layer and the metallic material are then subject to a removal process, e.g., a chemical mechanical polish (CMP) process that removes portions of the diffusion layer and the metallic material that are over the dielectric layer 360, forming the conductive structures 347a-347c and 345.

Figure 3B:
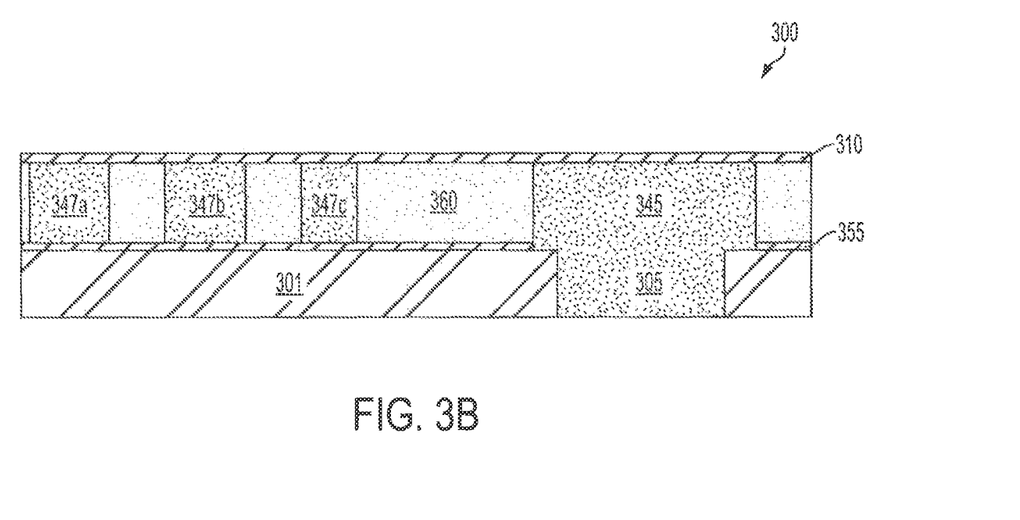

Referring to FIG. 2, the block 220 includes forming a first etch stop layer over the TSV structure. For example, an etch stop layer 310 is formed over the dielectric layer 360 as shown in FIG. 3B. In some embodiments, the etch stop layer 310 can be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Applicants find that hillocks may occur at the top surface (not labeled) of the conductive structure 345. If a metal-insulator-metal (MIM) capacitor structure were to be formed in contact with the etch stop layer 310, etching processes that are used to pattern the MIM capacitor structure may have substantially removed the etch stop layer 310 that covers the conductive structure 345. Chemicals of the etching processes would have resulted in corrosion at the top surface of the conductive structure 345. If a contact or via plug were formed over and in contact with the corroded conductive structure 345, a via or contact interconnect open might have occurred.

Figure 3C:
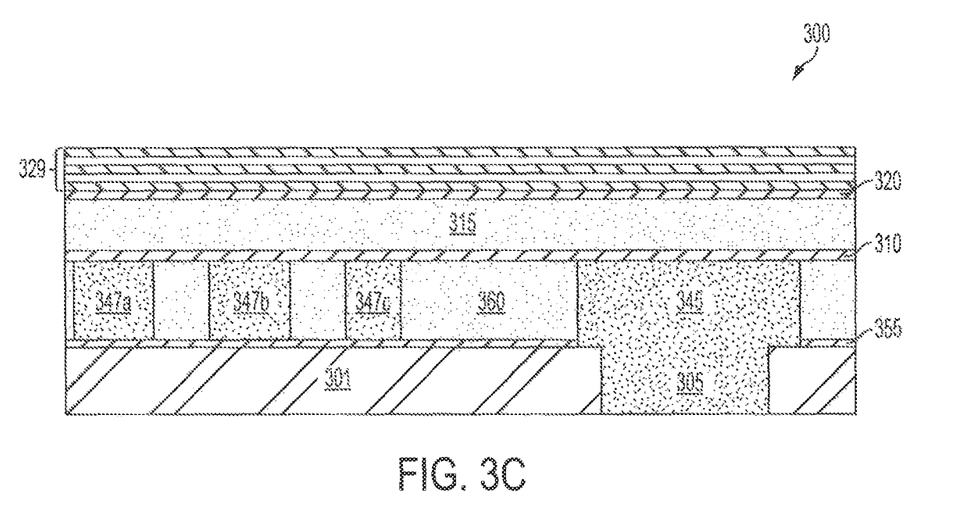

Instead of forming a MIM capacitor structure in contact with the etch stop layer 310, the method 200 includes forming a dielectric layer 315 in contact with the etch stop layer 310. Another etch stop layer 320 is then formed over the etch stop layer 310 as shown in FIG. 3C. The dielectric layer 315 and the etch stop layer 320 can be formed by processes that are the same as or similar to those forming the dielectric layer 360 and the etch stop layer 310, respectively.

After forming the etch stop layer 320, a metal-insulator-metal (MIM) capacitor structure is formed in contact with the second etch stop layer. In some embodiments, forming the MIM capacitor structure includes forming a multi-layer structure 329 as shown in FIG. 3C. The multi-layer structure 329 includes at least one metallic capacitor plate layer and at least one capacitor dielectric layer which are alternatively formed over the etch stop layer 320. In some embodiments, the at least one metallic capacitor plate layer can be formed by, for example, chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. The at least one capacitor dielectric layer can be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Figure 3D:
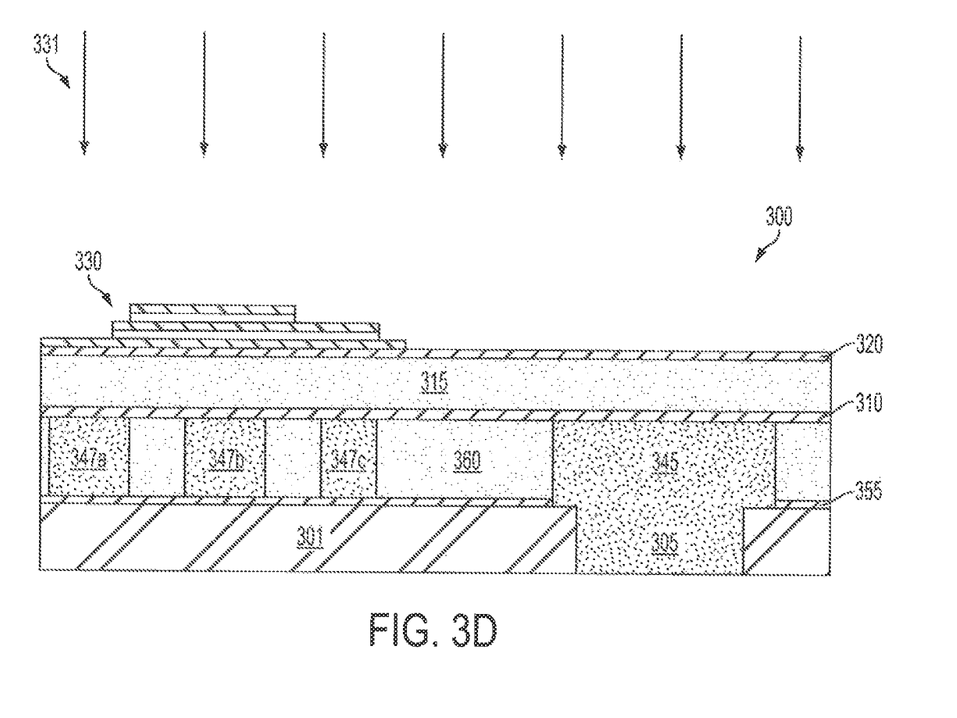

Referring to FIG. 3D, a removal process 331 removes portions of the multi-layer structure 329 to form a MIM capacitor structure 330. In some embodiments, the removal process 331 can include at least one photolithographic process and at least one etch process to pattern the MIM capacitor structure 330. The number of the photolithographic process and the etch process may depend on how many the metallic capacitor plate layer and the capacitor dielectric layer are formed over the etch stop layer 320.

As noted, the dielectric layer 315 and the etch stop layer 320 are formed over the etch stop layer 310. Even if hillocks occur at the top surface of the conductive structure 345, the removal process 331 does not remove the etch stop layer 310. Chemicals of the removal process 331 do not reach the surface of the conductive structure 345 and do not attack the hillocks and corrode the top surface of the conductive structure 345. A possibility that an electrical connection open may occur between the conductive structure 345 and a via plug formed thereon is reduced.

Figure 3E:
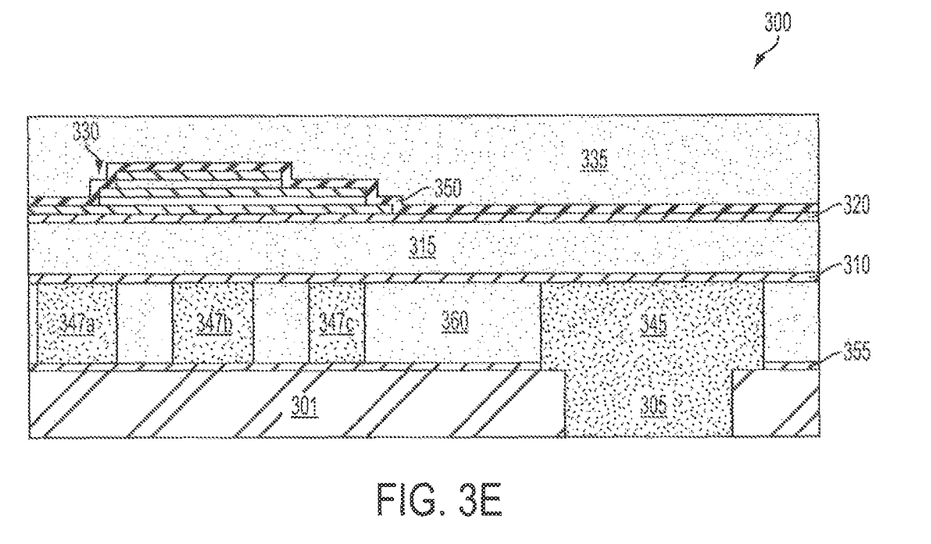

Referring to FIG. 2, the block 260 includes forming a first conductive structure that is formed through the first etch stop layer and the first dielectric layer, wherein the first conductive structure is electrically coupled with the TSV structure and the TSV structure is substantially wider than the first conductive structure. In some embodiments, a cap layer 350 and a dielectric layer 335 can be sequentially formed over the MIM capacitor structure 330 as shown in FIG. 3E. In some embodiments, the cap layer 350 and the dielectric layer 335 can each be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Figure 3F:
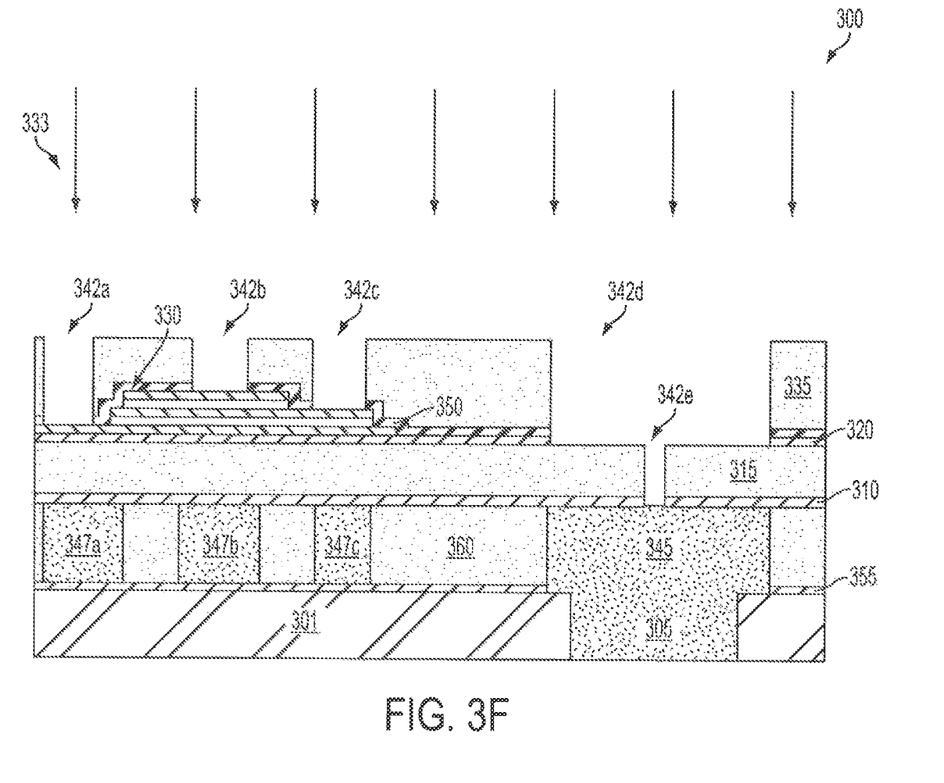

Referring to FIG. 3F, a removal process 333 removes portions of the dielectric layers 315 and 335, the cap layer 350 and the etch stop layer 320. The openings 342a-342d are formed in the dielectric layer 335 and the opening 342e is formed in the dielectric layer 315. For example, the openings 342a-342e can be formed by means which involves coating and patterning a photoresist layer (not shown) on the dielectric layer 335 and forming the openings 342a-342e through the dielectric layer 335 by a dry etch process. The remaining photoresist layer can be stripped by an ashing and/or with an application of a liquid stripper. In some embodiments, the opening 342a-342d can be referred to as trench openings. The opening 342e can be referred to as a via/contact opening. In some other embodiments, the removal process 333 can be referred to as a process for forming dual damascene openings.

Figure 3G:
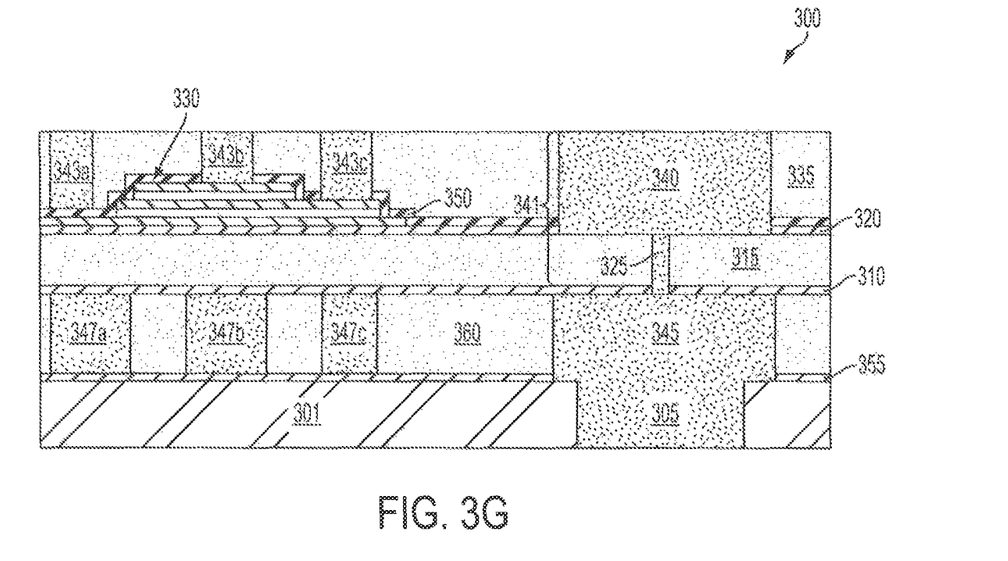

Referring to FIG. 3G, conductive structures 343a-343c, 340 and 325 are formed in the openings 342a-342e, respectively. In some embodiments, the process of forming the conductive structures 343a-343c, 340 and 325 includes forming a diffusion barrier layer (not shown) over the dielectric layer 335 and on the sidewalls of the openings 342a-342e by, for example, a CVD process, a PECVD process, a physical vapor deposition (PVD) process, an atomic layer deposition (ALD), other suitable processes, and/or any combinations thereof. A following metallic material can be deposited by a CVD, PVD, ALD, electroplating method, other processes that is suitable to fill the openings 342a-342e. The diffusion barrier layer and the metallic material are then subjected to a removal process, e.g., a chemical mechanical polish (CMP) process that removes portions of the diffusion layer and the metallic material that are over the dielectric layer 335, forming the conductive structures 343a-343c, 340 and 325.

In some embodiments, the processes of forming the conductive structures 343a-343c, 340 and 325 described above in conjunction with FIGS. 3F-3G can be referred to as a dual damascene process for forming a dual damascene structure. The conductive structure 325 can be referred to as a via portion of a dual damascene structure 341. The conductive structure 340 can be referred to as a trench portion of the dual damascene structure 341.

Figure 3H:
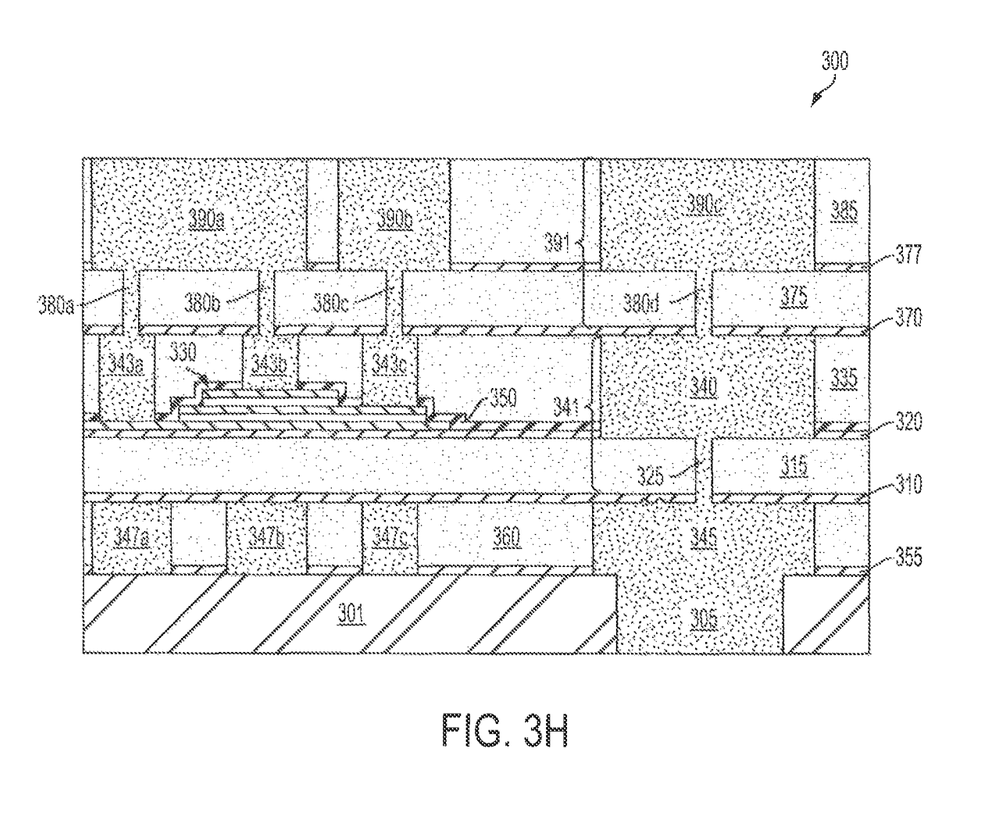

In some embodiments, an etch stop layer 370, a dielectric layer 375, an etch stop layer 377 and a dielectric layer 385 can be sequentially formed over the dielectric layer 335 as shown in FIG. 3H. Conductive structures 380a-380d and 390a-390c can be sequentially formed in the dielectric layers 375 and 385, respectively. In some embodiments, processes of forming the conductive structures 380a-380d and 390a-390c in the respective dielectric layers 375 and 385 can be the same as or similar to those forming the conductive structures 343a-343c, 340 and 325 described above in conjunction with FIGS. 3F-3G.

It is noted that the method 200 and the process stages described above in conjunction with FIGS. 2 and 3A-3H are merely exemplary. In some embodiments, the method 200 can be modified to form the semiconductor structure 100 described above in conjunction with FIG. 1A.

In a first embodiment of this application, a semiconductor structure includes a through-substrate-via (TSV) structure disposed in a substrate. A first etch stop layer is disposed over the TSV structure. A first dielectric layer is disposed in contact with the first etch stop layer. A first conductive structure is disposed through the first etch stop layer and the first dielectric layer. The first conductive structure is electrically coupled with the TSV structure. The TSV structure is substantially wider than the first conductive structure. A second etch stop layer is disposed in contact with the first dielectric layer. A metal-insulator-metal (MIM) capacitor structure is disposed in contact with the second etch stop layer.

In a second embodiment of this application, a method of forming a semiconductor structure includes forming a through-substrate-via (TSV) structure in a substrate. A first etch stop layer is formed over the TSV structure. A first dielectric layer is formed in contact with the first etch stop layer. A second etch stop layer is formed in contact with the first dielectric layer. A metal-insulator-metal (MIM) capacitor structure is formed in contact with the second etch stop layer. A first conductive structure is formed through the first etch stop layer and the first dielectric layer, wherein the first conductive structure is electrically coupled with the TSV structure and the TSV structure is substantially wider than the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a through-substrate-via (TSV) structure disposed in a substrate;
a first etch stop layer disposed over the TSV structure;
a first dielectric layer disposed in contact with the first etch stop layer;
a first conductive structure disposed through the first etch stop layer and the first dielectric layer, the first conductive structure being electrically coupled with the TSV structure, wherein the TSV structure is substantially wider than the first conductive structure;
a second etch stop layer disposed in contact with the first dielectric layer; and
a metal-insulator-metal (MIM) capacitor structure disposed in contact with the second etch stop layer.

2. The semiconductor structure of claim 1, further comprising:

a second dielectric layer disposed over the MIM capacitor structure; and a second conductive structure disposed in the second dielectric layer, the second conductive structure being electrically coupled with the first conductive structure, wherein the second conductive structure is substantially wider than the first conductive structure.

3. The semiconductor structure of claim 2, wherein the first conductive structure and the second conductive structure constitute a dual damascene structure, the first conductive structure is a via portion of the dual damascene structure, and the second conductive structure is a trench portion of the dual damascene structure.

4. The semiconductor structure of claim 2, wherein the first dielectric layer is a via inter metal dielectric (IMD) layer and the second dielectric layer is a trench IMD layer.

5. The semiconductor structure of claim 1, further comprising:

a third conductive structure disposed between the TSV structure and the first etch stop layer, the third conductive structure being electrically coupled with the first conductive structure, wherein the third conductive structure is substantially wider than the first conductive structure.

6. The semiconductor structure of claim 5, wherein the third conductive structure is wider than the TSV structure.

7. The semiconductor structure of claim 5, further comprising:

a cap layer disposed over the MIM capacitor structure, wherein the third conductive structure is disposed through the second dielectric layer, the second etch stop layer and the cap layer.

8. The semiconductor structure of claim 1, wherein the first conductive structure is not configured to provide electrical routing in the first dielectric layer.

* * * * *